United States Patent
Beyer

(10) Patent No.: US 7,560,357 B2
(45) Date of Patent: Jul. 14, 2009

(54) METHOD FOR CREATING NARROW TRENCHES IN DIELECTRIC MATERIALS

(75) Inventor: Gerald Beyer, Leuven (BE)

(73) Assignee: Interuniversitair Microelektronica Centrum, Leuven (BE)

( * ) Notice: Subject to any disclaimer, the term of this patent is extended or adjusted under 35 U.S.C. 154(b) by 505 days.

(21) Appl. No.: 11/532,190

(22) Filed: Sep. 15, 2006

(65) Prior Publication Data
US 2007/0066028 A1    Mar. 22, 2007

Related U.S. Application Data

(60) Provisional application No. 60/718,062, filed on Sep. 16, 2005.

(51) Int. Cl.
  H01L 21/8238  (2006.01)
  H01L 21/336   (2006.01)
  H01L 21/76    (2006.01)
  H01L 29/76    (2006.01)
  H01L 29/00    (2006.01)

(52) U.S. Cl. .............. 438/424; 438/296; 438/427; 438/221; 257/374; 257/510

(58) Field of Classification Search ........... 438/424, 438/296, 425–435, 362; 257/374, 510
See application file for complete search history.

(56) References Cited

U.S. PATENT DOCUMENTS

| | | | | |
|---|---|---|---|---|
| 5,310,626 A | | 5/1994 | Fernandes et al. | |
| 5,780,340 A | * | 7/1998 | Gardner et al. | 438/259 |
| 5,976,949 A | * | 11/1999 | Chen | 438/427 |
| 6,242,336 B1 | * | 6/2001 | Ueda et al. | 438/619 |
| 6,388,303 B1 | * | 5/2002 | Misawa et al. | 257/510 |
| 6,589,853 B2 | * | 7/2003 | Kumamoto | 438/424 |
| 7,001,804 B2 | * | 2/2006 | Dietz et al. | 438/164 |
| 7,029,989 B2 | * | 4/2006 | Kim et al. | 438/429 |

FOREIGN PATENT DOCUMENTS

EP    1521302 A1    4/2005

OTHER PUBLICATIONS

Extended European Search Report in Application No. 05447238.6, mailed Jan. 15, 2009.
J.P. Gueneau De Mussy et al: "Selective Sidewall Airgap Integration for Deep Submicrometer Interconnects," Electrochemical and Solid-State Letters, vol. 7, No. 11, Oct. 19, 2004, pp. G286-G289, XP002504577.

* cited by examiner

*Primary Examiner*—Chuong A. Luu
(74) *Attorney, Agent, or Firm*—McDonnell Boehnen Hulbert & Berghoff LLP

(57) ABSTRACT

A method for producing narrow trenches in semiconductor devices. The narrow trenches are formed by chemically changing the properties of a first dielectric layer locally, such that the side walls of a patterned hole in the first dielectric layer is converted locally and becomes etchable by a first etching substance. Subsequently a second dielectric material is deposited in the patterned structure and the damaged part of the first dielectric material is removed such that small trenches are obtained.

19 Claims, 8 Drawing Sheets

CROSS SECTION

TOP VIEW

METHOD FOR CREATING NARROW TRENCHES IN DIELECTRIC MATERIALS

PRIORITY

The present application claims priority to U.S. filed provisional patent application U.S. 60/718,062 filed Sep. 16, 2005.

FIELD

The present invention is related to the field of semiconductor processing. More specifically, the present invention is related to the production of micro and nano-electromechanical systems, to the production of narrow trenches in semiconductor devices, and to the production of low dielectric isolation for interconnects.

BACKGROUND

Interconnects have been, are, and will continue to be a limiting factor for the performance and cost of integrated circuits. As technology scales down further, the problems associated with interconnects become ever more pressing. The introduction of low-resistive copper as an alternative interconnect material for aluminum presents researchers with some new challenges, since copper cannot be implemented in the same manner as aluminum alloys.

As feature sizes shrink, narrower copper trenches need to be formed. Also to facilitate closer packing and multilevel connections, trenches are getting proportionally deeper as they get narrower. These deep trenches etched into the dielectric must be filled completely, without voids or defects. With current technology, the deeper the trench, the more likely there will be defects.

"Dual-Damascene" methods are currently used to etch the trenches, fill them electrolytically, then mechanically polish away the excess metal using a chemically active slurry. Etching and filling narrow structures with high aspect ratios will be especially difficult for dual-Damascene architectures.

The challenge is to address narrower trenches; the goal is to make trenches having a width of about 20 to 30 nm, with an aspect ratio of 10 to 1 (ratio length to width).

The Semiconductor Industry Association's most recent National Technology Roadmap predicts that new lithography methods will be able to go as far as a trench width of 50 nm to 60 nm with an aspect ratio of 3 to 1 by 2006.

SUMMARY

Because current damascene techniques for filling future narrow trenches (e.g., barrier deposition techniques such as ALD and CVD) are not straight forward in these small trenches (having a width of 20-30 nm and aspect ratio of 10 to 1), it would be very helpful to have an alternative patterning method or at least a test structure available for these narrow trenches.

Thus, a method is disclosed for the production of narrow trenches in a semiconductor device. More specifically a method is disclosed to produce one or more narrow trenches having a width smaller than 40 nm, preferably in the approximate range of 20 nm to 30 nm and having an aspect ratio (ratio of depth versus width) preferably in the range of about 10 and 2, and more preferably between the range of about 10 and 1.

To fabricate the narrow trenches, first a temporary structure is patterned within a first dielectric material (preferably SiCO(H) such as Black Diamond®). The temporary structure is defined by photolithographic patterning and has a non-critical design. However, parts of this structure will be used to create the narrow trenches of the present invention.

During the etching of the temporary structure, the sidewalls of the temporary pattern are damaged and/or chemically converted. More specifically, the sidewalls of the temporary pattern in the first dielectric material are damaged in a controlled way (e.g. by choosing the right selectivity of plasma used during patterning of the temporary structure or by performing an extra conversion step such as chemical oxidation of the sidewalls). The damage is such that the damaged portion becomes etchable by an etchant. Preferably the etchant comprises HF (fluoridric acid), more preferred less than 5% HF and most preferred about 1% HF.

A second dielectric material is then deposited within the temporary structure and the overburden of the second dielectric material is removed until it reaches the upper level of the first dielectric material (etchback or CMP). The second dielectric material can be a SiCO(H) dielectric material deposited by CVD (identical or not identical to the first dielectric material) but is preferably a spin-on dielectric low-k material (i.e., k value lower than 3.9) such as LKD® commercially available from JSR, Zirkon® commercially available from Shipley, NCS® commercially available from CCIC, etc.

Subsequently an etch process is used to remove the damaged part of the first dielectric material such that very small or narrow trenches are created. The etch process must be selective towards the damaged portion of the first dielectric material.

The narrow trenches are characterized as trenches having a width smaller than 50 nm, preferably in the approximate range of 20 nm to 30 nm and having an aspect ratio (ratio of depth versus width) of about 10 to 2 or even more preferred of about 10 to 1.

The narrow trenches can be used as test vehicle to study and optimize barrier deposition, seed layer deposition, and copper plating within very small trenches (10-30 nm width).

The present invention provides a method for making narrow trenches within a dielectric material, comprising the steps of:
- depositing an etchstop layer onto a substrate
- depositing a first dielectric layer on top of the etchstop layer,
- patterning a temporary pattern in the first dielectric layer,
- damaging (or converting) the sidewalls of the temporary pattern such that they become etchable by an etchant,
- depositing a second dielectric layer within the temporary structure,
- removing the overburden of the second dielectric material such that the upper level of the second dielectric layer equals the level of the first dielectric layer,
- selectively removing the damaged part in the first dielectric layer with an etchant such that narrow trenches are created.

In a method according to the invention, the narrow trenches preferably have a width smaller than 50 nm, more preferably smaller than 40 nm and most preferred smaller than 30 nm.

Preferably, the width of the trenches is in the approximate range of 50 nm to 10 nm, more preferably between about 40 nm and about 20 nm, and even more preferably between about 30 nm and about 20 nm.

Preferably, the aspect ratio varies from about 10 to 2 and even more preferred from about 10 to 1.

In a method according to the invention, the "selective" etching is preferably a wet etching and the etchant preferably comprises HF. The first etchant composition can comprise less than about 5 wt. % HF, preferably less than about 2 wt. %

HF and more preferably about 1 wt. % HF. The selective etching can also be a dry etching process.

In a method according to the invention, the first and second dielectric material should be resistant to the etchant.

In a method according to the invention, the patterning of the temporary structure in the first dielectric layer can be performed by an oxidizing plasma, wherein the plasma may comprise oxygen and may further comprise a (hydro)fluorocarbon compound.

In a method according to the invention, the step of patterning the temporary pattern and damaging the sidewalls of the temporary structure are performed simultaneously.

Alternatively, the sidewalls can also be damaged in a separate process step.

The present invention also provides a method for making a semiconductor device that includes the disclosed method for making narrow trenches.

The present invention also describes a device comprising narrow trenches that are obtainable by a method of the invention. The narrow trenches preferably have a width smaller than 50 nm, more preferably smaller than 40 nm, and most preferred smaller than 30 nm. More specifically, the width of the narrow trenches is in the approximate range of 50 nm to 10 nm, preferably between about 40 nm and about 20 nm and more preferably between about 30 nm and about 20 nm. The aspect ratio of the narrow trenches varies from about 10 to 2 and more preferred from about 10 to 1.

BRIEF DESCRIPTION OF THE DRAWINGS

All figures/drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 1 illustrates the photolithographic patterning of a temporary pattern.

FIG. 2 illustrates the patterning (dry etching) of the temporary pattern into the first dielectric layer with preferably simultaneously converting the sidewalls of the temporary pattern such that they become etchable by an etchant. (if needed an extra resist ash/strip step is performed to remove any photolithographic residues).

FIG. 3 illustrates the deposition of a second dielectric layer such that the temporary pattern is completely filled with the second dielectric material (also referred to as dielectric fill).

FIG. 4 illustrates the removal of part of the second dielectric layer (also referred to as planarization) such that the upper level of the second dielectric layer equals the level of the first dielectric layer. This step can be carried out by chemical mechanical polishing or etchback (wet or dry).

FIG. 5 illustrates the (optional) bond pad clear out step. The cross-section of FIG. 5 clearly shows the clear out of the bond pads that create open structures at both ends of the (narrow) trenches.

FIG. 6 illustrates the selective etch process used to remove the damaged part of the first dielectric material such that very small or narrow trenches are created.

DESCRIPTION

Figure 1:
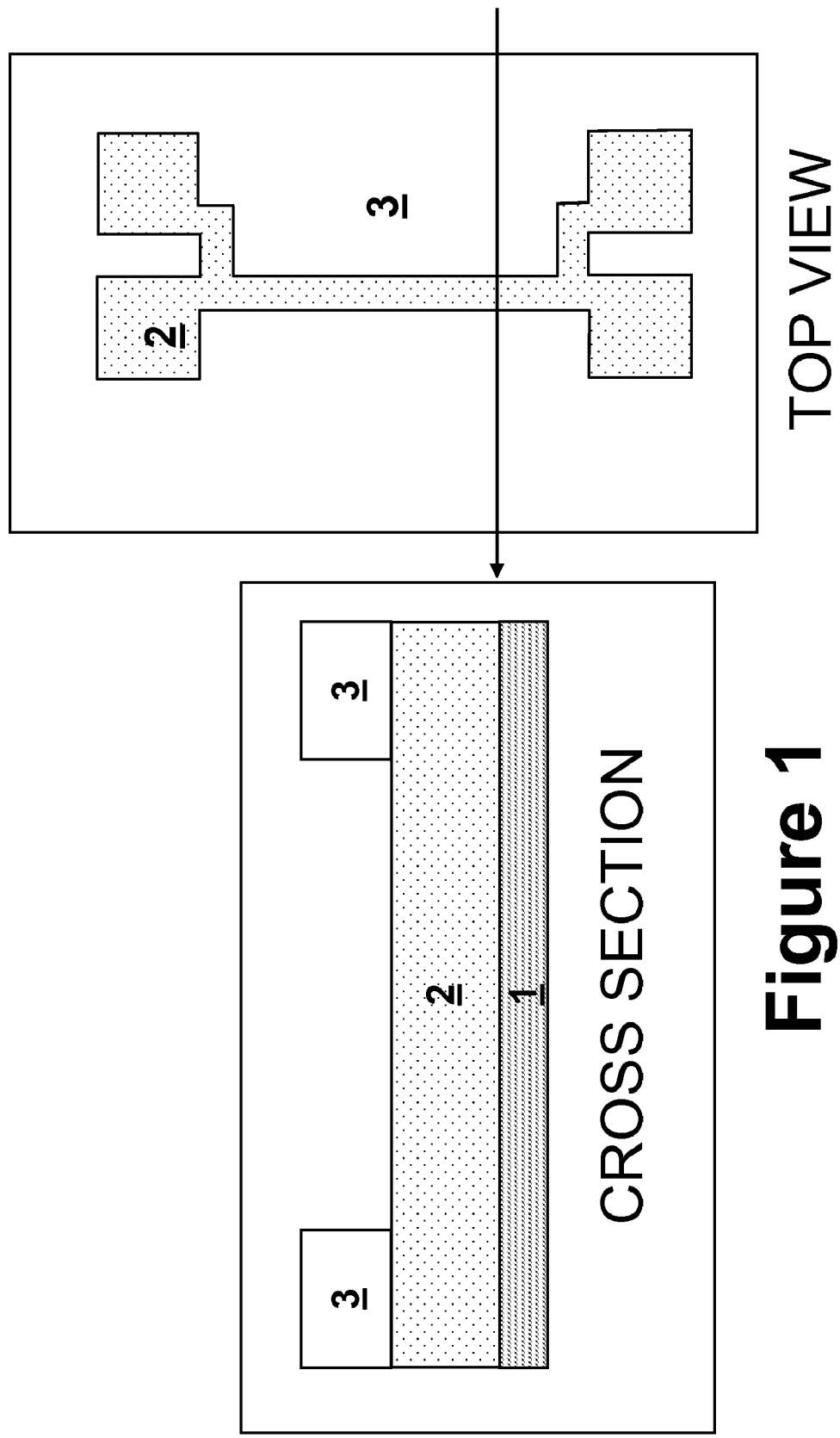
FIGS. 1 to 6 illustrate the different processing steps of a method according to the present invention to form narrow trenches.

The present invention provides a method for the production of narrow trenches in a semiconductor device. More specifically, a method is disclosed to produce narrow trenches having a width smaller than 50 nm and more preferred having a width of about 20 nm to about 30 nm and an aspect ratio of about 10 to 2 (ratio of depth versus width) and more preferred having an aspect ratio of about 10 to 1.

The formation of narrow trenches is based on chemically changing the properties of a first dielectricum locally, such that part of the first dielectricum is chemically altered and becomes etchable by an etchant.

Preferably first, a temporary pattern is created in the first dielectricum. The temporary structure is defined by photolithographic patterning and has a non-critical design. Parts of this structure will be used to create the narrow trenches of the present invention. The sidewalls of the temporary pattern are damaged and/or converted such that these sidewalls become etchable by a first etching substance.

Within the temporary pattern a second dielectricum is deposited, and if necessary, planarized such that its upper level equals the level of the first dielectricum. The planarizing step can be chemical mechanical planarization (CMP) or etchback.

The conversion (preferably an oxidation step) within the first dielectricum can be established during the patterning of the temporary structure (done by anisotropic dry etching) in an oxygen containing plasma or ex-situ by introducing an oxidizing step e.g. UV/ozone treatment or supercritical carbon-dioxide with addition of an oxidizer.

The method according to the invention for the production of narrow trenches used for interconnects in a semiconductor device is illustrated in FIGS. 2 to 7. The method starts with the deposition of an etchstop layer 1 onto a substrate. The substrate can be a Si wafer comprising active devices or any substrate suitable for semiconductor processing. The etch stop layer can be SiC, SiN, etc.

Subsequently, a first dielectric layer 2 will be deposited onto the etchstop layer 1. The thickness of the layer will determine the depth of the narrow trenches created by this invention, if narrow trenches having a width of about 20 nm to about 40 nm are desired, the thickness of the deposited first dielectric layer is preferably in the approximate range of 200 nm to 400 nm, such that aspect ratios of about 10 to 2 or even about 10 to 1 can be obtained in the final fabricated trenches.

The deposition of the first dielectric material 2 can be performed by a method such as, for example, Plasma Enhanced Chemical Vapor Deposition (PE-CVD), Chemical Vapor Deposition (CVD), spin-on deposition, etc. Examples of the first dielectric material 2 are Organo Silicate Glass (OSG); (hydrogenated) silicon oxycarbides, which are also commonly referred to as SiOC(H) materials; or Carbon doped oxides (including higher porosity derivatives). Examples of these materials are commercially available materials such as ®Black Diamond (referred to as BD), ®Coral, or ®Aurora.

In the first dielectric layer, a temporary structure is patterned. To achieve this, photosensitive layers 3 (comprising at least a resist and an anti-reflective coating) are deposited onto the first dielectric layer 2 and the temporary pattern is transferred into the photosensitive layers 3 by photolithographic processing. By means of dry etch patterning, the temporary pattern will be transferred into the first dielectric layer 2. The remaining resist and polymers (not shown) are removed by a combination of dry ash plasma and wet strip.

If needed, a (metal) hardmask layer may be additionally deposited (situated in between the first dielectric layer and photosensitive layer), which may facilitate the dry etch processing.

The sidewalls of the temporary pattern in the first dielectric layer 2 need to be converted (also referred to in this application as "damage") such that they become etchable by an etchant.

The conversion of the first dielectric material 2 into converted dielectric material 4 can be performed in-situ (simultaneously) during the dry etching (patterning) of the first dielectric material 2 and/or ashing using an oxidizing plasma.

The conversion of the first dielectric material 2 into converted/damaged dielectric material 4 can also be ex-situ by performing an additional (oxidizing) treatment to the first dielectric material 2 after the dry etching of the first dielectric material 2 such as UV-ozone treatment, Super Critical $CO_2$ ($SCCO_2$) with addition of an oxidizer. Several other oxidizing treatments are applicable to oxidize the dielectric material 2.

In case the first dielectric material 2 is e.g. a SiCO(H) material such as Black Diamond, the conversion leads to a reduced carbon concentration in the converted dielectric 4 as compared to original first dielectric material 2. The converted dielectric material 4 is a carbon depleted SiCO(H) material. The extent of the conversion of the first dielectric material 2 into converted dielectric material 4 depends on the type of SiCO(H) material, more specifically on the porosity and carbon content of the first dielectric material 2. SiCO(H) material that has had all carbon removed, may also be referred to as a $SiO_x$ material. A $SiO_x$ film corresponds to a Si (silicon) and O (oxygen) containing film, where both elements are not stoichiometrically related. This sort of film typically has more defects and is less cross-linked as compared to stochiometric $SiO_2$. Because the $SiO_x$ material is less cross-linked, the $SiO_x$ material is more susceptible to HF etching (removal process).

Figure 2:
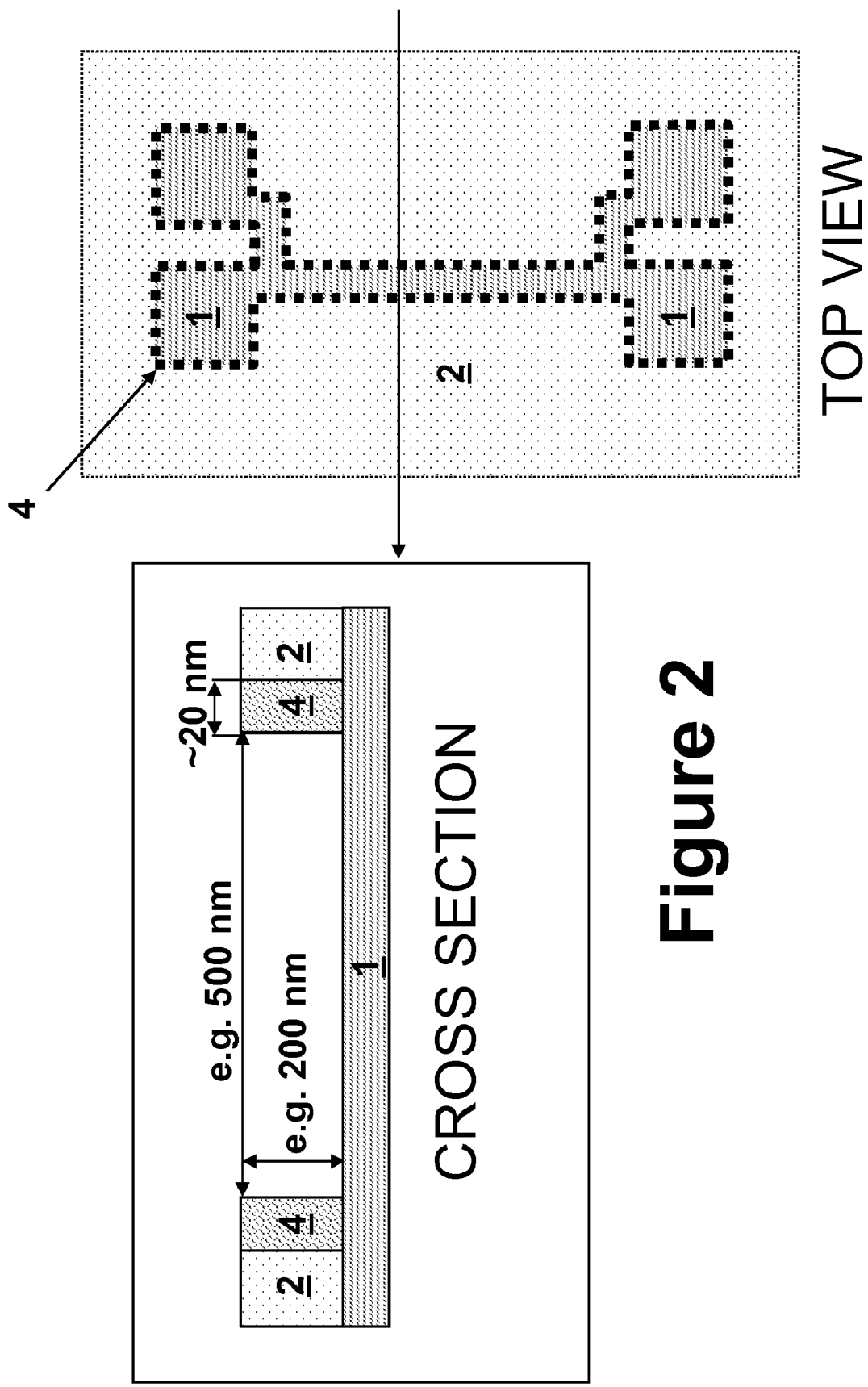
Figure 3:
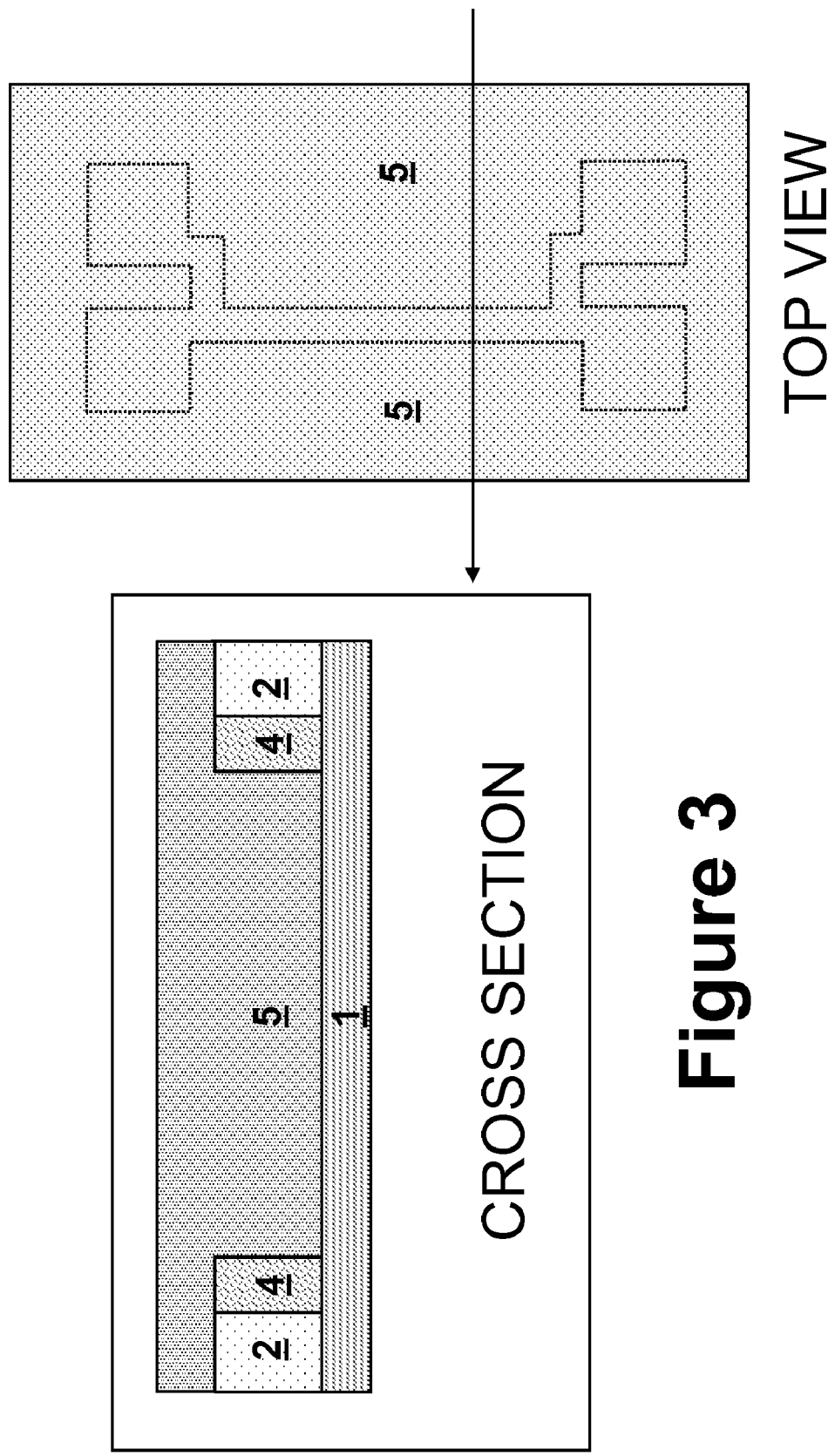

The temporary pattern comprising the converted/damaged sidewalls is illustrated in FIG. 2, the front view and top view of the structure show clearly the dimensions of the damaged areas 4 towards the undamaged areas 2.

A second dielectric layer 5 made of a second dielectric material is then deposited within the temporary structure. The second dielectric material can be identical to the first dielectric material 2 but this is not preferred. Preferably, the second dielectric material 5 is a spin-on dielectricum that can be deposited very conformally, and is able to fill the temporary structure completely. An example of the spin-on dielectric low-k materials (i.e., k value lower than 3.9) is commercially available LKD® from JSR, Zirkon® from Shipley, NCS® from CCIC, etc.

Figure 4:
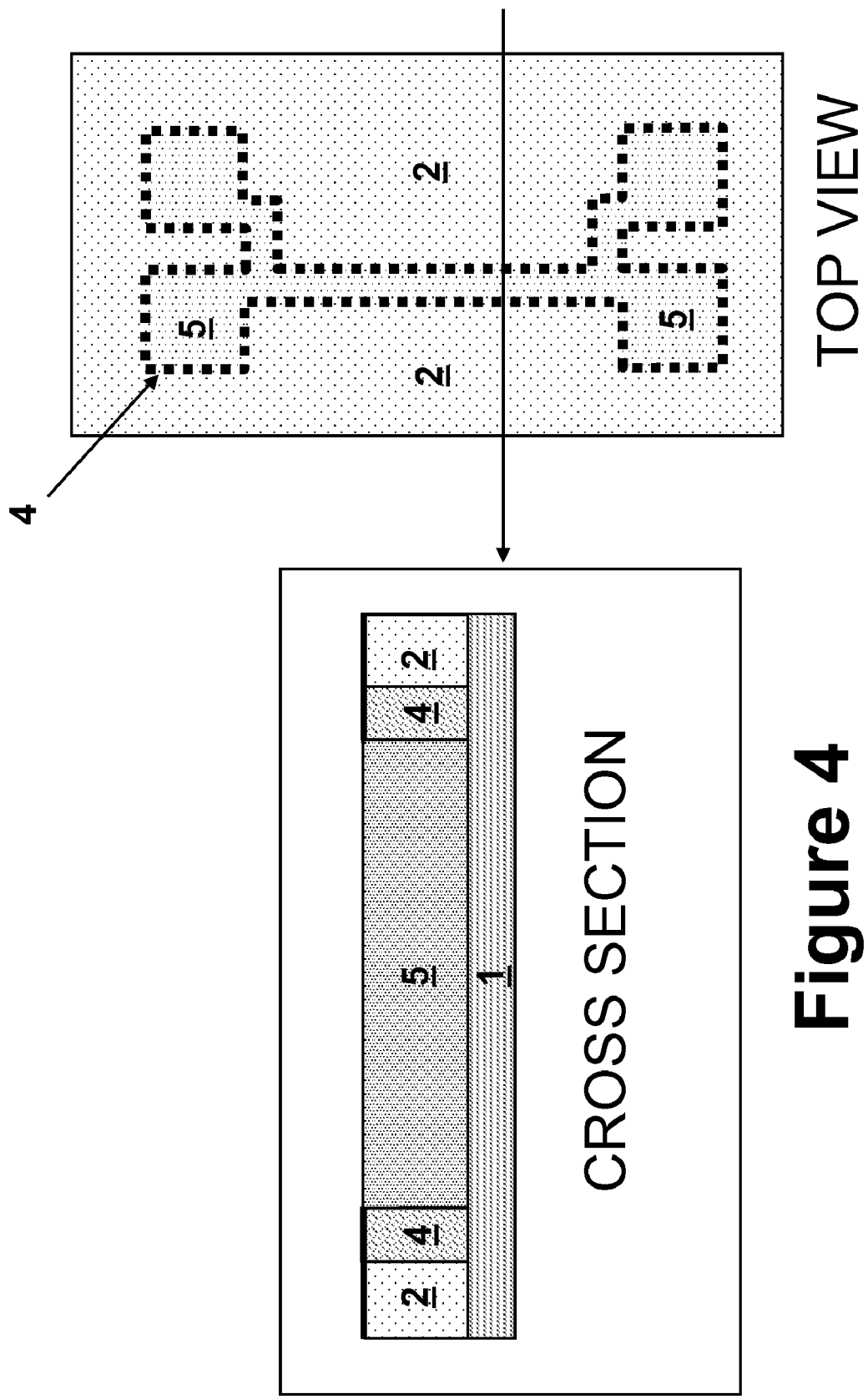

If needed the overburden of the second dielectric material 5 will be removed such that the upper level of the second dielectric layer 5 equals the level of the first dielectric layer 2. The removal process, also referred to as planarization, can be performed by chemical mechanical polishing or etchback (wet or dry). The resulting structure (top view and side view) is shown in FIG. 4.

Figure 5:
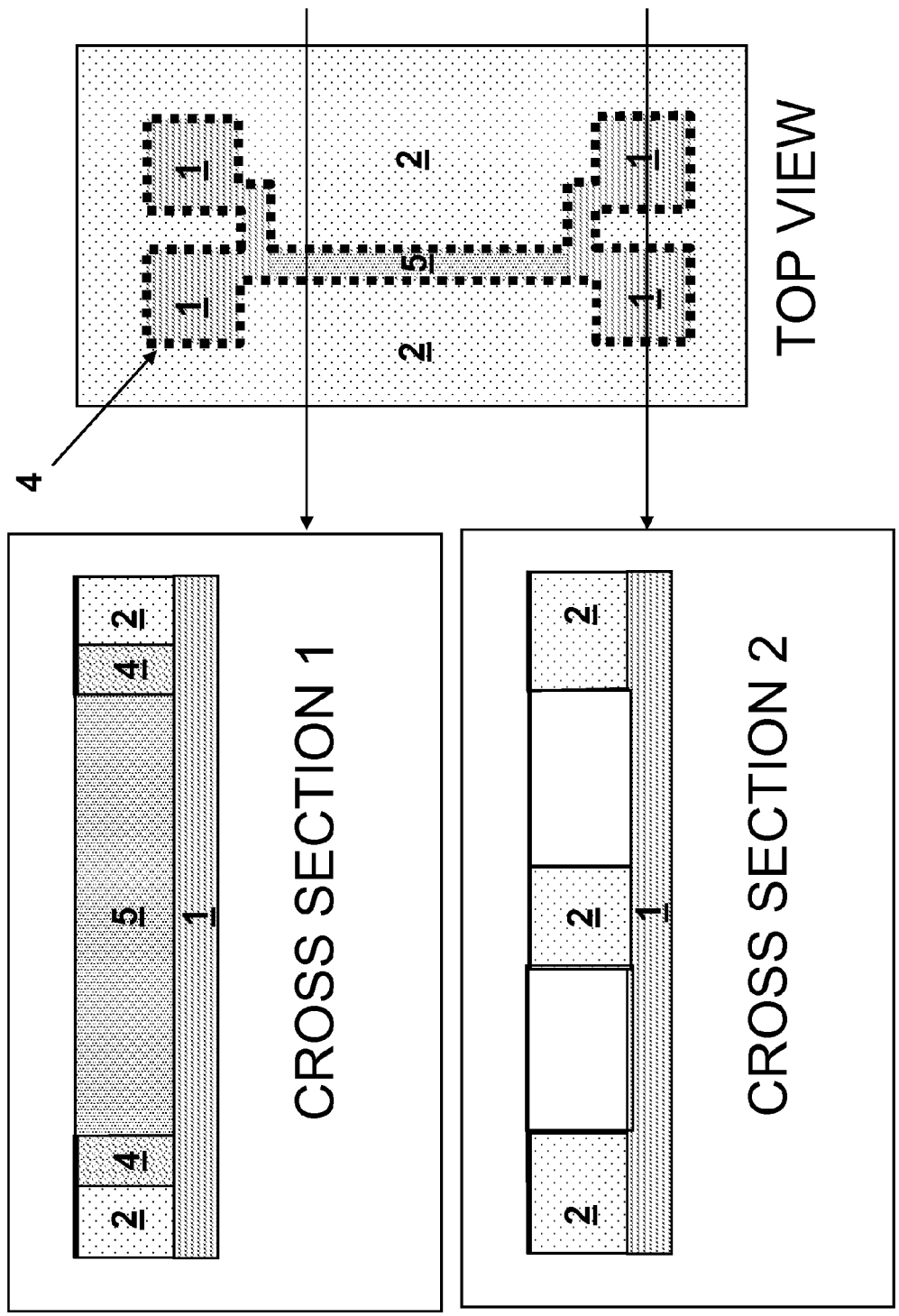

If needed, there is a clear out of the bond pads, which is shown in FIG. 5. The bond pads may be needed if electrical measurements and/or reliability studies are required to evaluate the quality of the narrow trenches (after filling them with conductive material). To perform the bond pad clear out, a second photolithographic pattern is transferred into the second dielectric layer 5 and stops on the etchstop layer 1. The removal of the second dielectric material in the bond pads can be achieved by anisotropically etching. The second cross-section of FIG. 5 clearly shows the clear out of the bond pads creating open structures at both ends of the (narrow) trenches.

Figure 6:
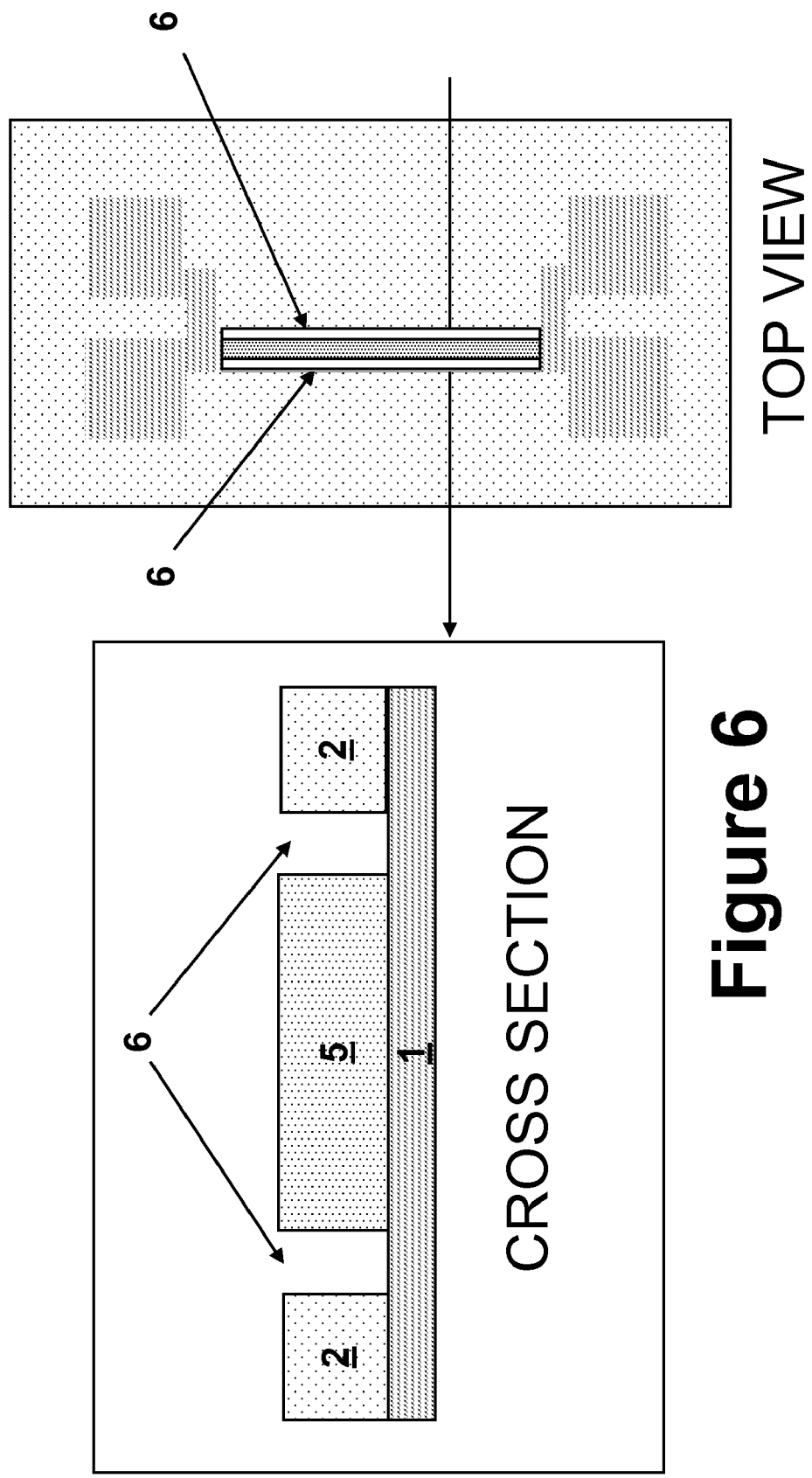

Finally, the damaged/converted part 4 of the first dielectric layer 2 is removed by means of a selective etch process, which removes the damaged/converted part in the first dielectric layer 2 with an etchant such that narrow trenches 6 are created. The resulting structure comprising the narrow trenches 6 is illustrated in FIG. 6.

In a method according to the invention, the "selective" etching is preferably a wet etching and the etchant preferably comprises HF. The first etchant composition can comprise less than about 5 wt. % HF, preferably less than about 2 wt. % HF and more preferably about 1 wt. % HF. The selective etching can also be a dry etching process. Preferably this selective etching is performed by dipping the structures in an aqueous solution comprising HF.

In a method according to the invention, the first dielectric material 2 and second dielectric material 5 must be resistant to the etchant.

In a method according to the invention, the patterning (dry etching) of the temporary structure in the first dielectric layer 2 can be performed by an oxidizing plasma, wherein the plasma may comprise oxygen and may further comprise a (hydro)fluorocarbon compound.

In a method according to the invention the converted dielectric material 4 has preferably in-plane dimensions smaller than 50 nm and most preferred of about 20 nm to 40 nm.

The trenches as described in this invention are preferably part of a (dual) damascene structure in the back end of line (BEOL) of a semiconductor device or can be used as interconnect structures in the BEOL.

The trenches as described in this invention are preferably used to study and optimize barrier layer, seed layer and/or copper deposition processes within narrow trenches.

Figure 7:
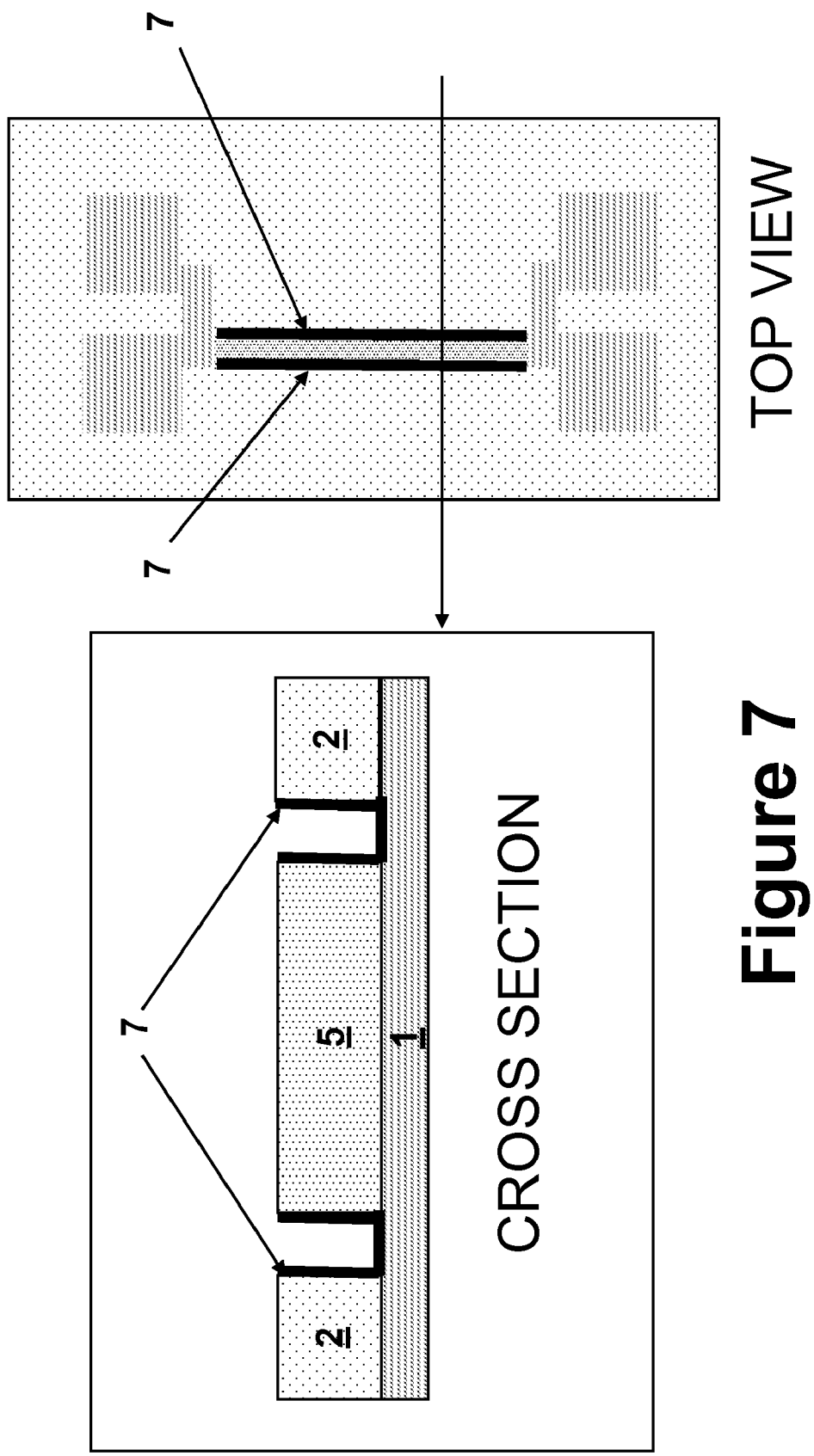
FIG. 7 illustrates the deposition of a barrier layer (and optionally a seed layer) onto the sidewalls of the narrow trenches.

FIG. 7 illustrates the deposition of a barrier layer 7 (and optionally a seed layer) within the narrow trenches.

Figure 8:
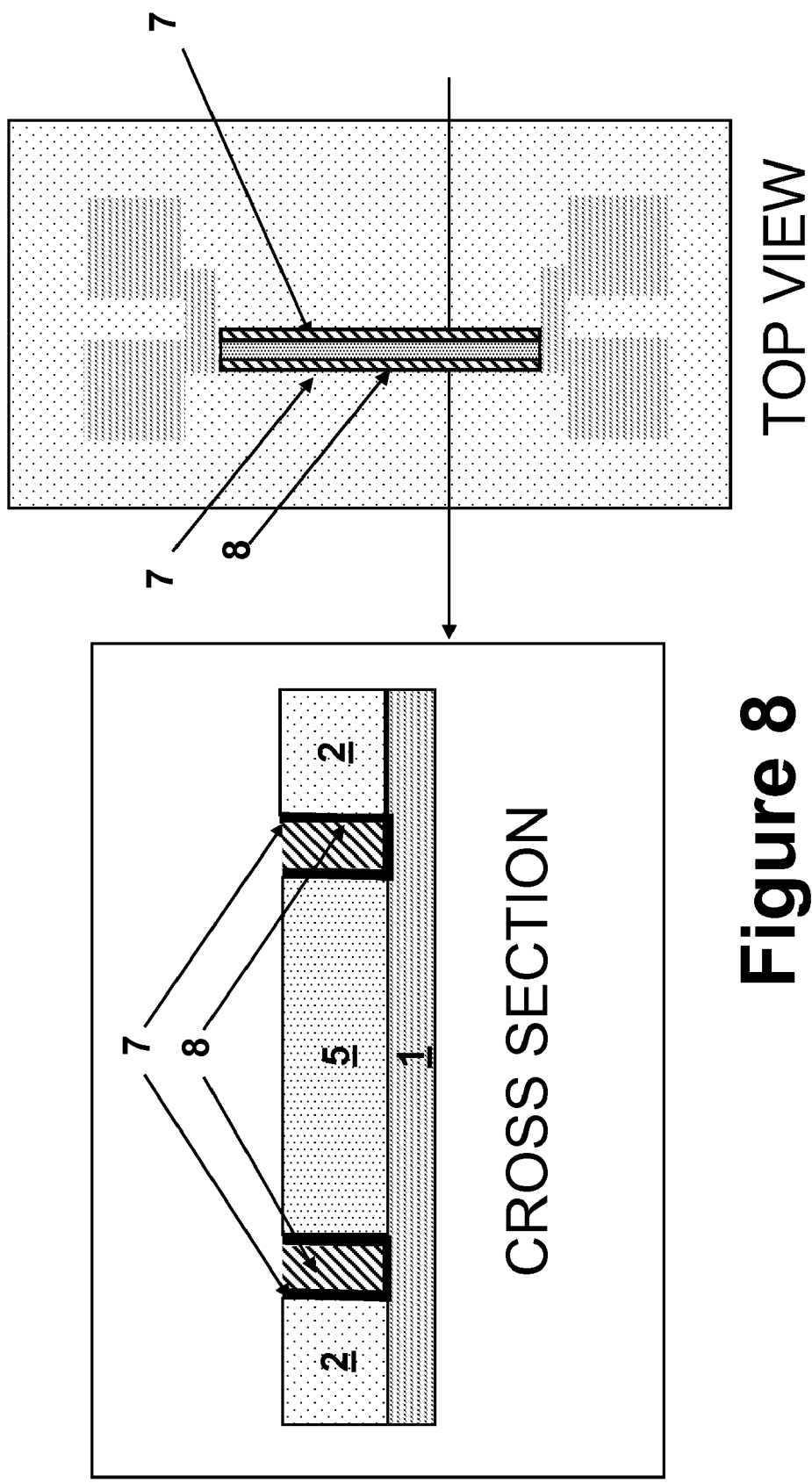
FIG. 8 illustrates the deposition of copper (e.g., plating) within the narrow trenches.

FIG. 8 illustrates the deposition of conductive material 8 (e.g. copper deposition by plating processes) within the narrow trenches. The planarization steps needed to remove the overburden of material (barrier layer and/or copper) are not shown in the Figures.

I claim:

1. A method for making trenches having a width smaller than 40 nm, the method comprising:
    depositing an etchstop layer onto a substrate;
    depositing a first dielectric layer on top of the etchstop layer;
    patterning a temporary structure in the first dielectric layer;
    modifying the sidewalls of the temporary patterned structure such that a portion of the sidewalls becomes etchable by an etchant;
    depositing a second dielectric layer within the temporary structure;
    removing overburden of the second dielectric material such that the upper level of the
    second dielectric layer equals the level of the first dielectric layer; and
    selectively removing the portion of the sidewalls with an etchant such that narrow trenches are created, wherein the first and second dielectric materials are resistant to the etchant.

2. The method as in claim 1, wherein modifying the sidewalls comprises performing at least one of damaging the sidewalls and converting the sidewalls.

3. The method as in claim 1, wherein patterning the temporary structure comprises:

depositing photosensitive layers onto the first dielectric layer;

lithographically transferring the temporary structure into the photosensitive layers; and transferring the temporary structure into the first dielectric layer by dry-etching.

4. The method as in claim 1, wherein at least one of a hardmask and a metal hardmask is deposited on top of the first dielectric material.

5. The method as in claim 1, wherein patterning the temporary structure and modifying the sidewalls of the temporary structure are performed simultaneously.

6. The method as in claim 5, wherein patterning the temporary structure and modifying the sidewalls of the temporary structure are performed by an oxidizing plasma.

7. The method as in claim 6, wherein the plasma comprises oxygen.

8. The method as in claim 6, wherein the plasma comprises at least one (hydro)fluorocarbon compound.

9. The method as in claim 1, wherein the etchant comprises a wet etchant that includes HF.

10. The method as in claim 9, wherein the etchant comprises less than 5 wt. % HF.

11. The method as in claim 1, wherein the first dielectric material comprises a SiCO(H) material.

12. The method as in claim 1, wherein the second dielectric material comprises a spin-on low-k material.

13. The method as in claim 1, wherein modifying the sidewalls of the temporary structure is performed by an UV/ozone treatment with addition of an oxidizer.

14. The method as in claim 1, wherein modifying the sidewalls of the temporary structure is performed by a $SCCO_2$ treatment with addition of an oxidizer.

15. The method as in claim 1, wherein the portion of the sidewalls has in-plane dimensions smaller than 50 nm.

16. The method as in claim 1, wherein the narrow trenches have an aspect ratio of about 10 to 1.

17. The method as in claim 1, further comprising:
depositing a barrier layer within the narrow trenches; and
depositing a conductive material onto at least one of a seed layer and the barrier layer to create completely filled trenches.

18. The method as in claim 17, further comprising:
depositing the seed layer onto the barrier layer.

19. The method as in claim 1, wherein the narrow trenches have a width that is less than 40 nm.

* * * * *